(12) United States Patent
Nakata et al.

(10) Patent No.: US 8,748,274 B2
(45) Date of Patent: Jun. 10, 2014

(54) METHOD FOR FABRICATING SEMICONDUCTOR DEVICE

(75) Inventors: Ken Nakata, Kanagawa (JP); Seiji Yaegashi, Kanagawa (JP)

(73) Assignee: Sumitomo Electric Device Innovations, Inc., Kanagawa (JP)

( * ) Notice: Subject to any disclaimer, the term of this patent is extended or adjusted under 35 U.S.C. 154(b) by 886 days.

(21) Appl. No.: 12/640,347

(22) Filed: Dec. 17, 2009

(65) Prior Publication Data

US 2010/0159656 A1 Jun. 24, 2010

(30) Foreign Application Priority Data

Dec. 19, 2008 (JP) ................................. 2008-324798

(51) Int. Cl.
| | | |
|---|---|---|
| H01L 21/336 | (2006.01) | |
| H01L 29/778 | (2006.01) | |
| H01L 29/423 | (2006.01) | |
| H01L 29/51 | (2006.01) | |
| H01L 29/20 | (2006.01) | |

(52) U.S. Cl.
CPC ........ H01L 29/7789 (2013.01); H01L 29/7787 (2013.01); H01L 29/7788 (2013.01); H01L 29/4236 (2013.01); H01L 29/517 (2013.01); H01L 29/2003 (2013.01); H01L 29/513 (2013.01)
USPC ........... 438/285; 438/287; 438/590; 438/591; 438/779; 438/785; 257/E21.441; 257/E21.489

(58) Field of Classification Search
USPC ................. 438/285, 779, 785, 287, 590, 591; 257/E21.403, E21.441, E21.489
See application file for complete search history.

(56) References Cited

U.S. PATENT DOCUMENTS

| | | | |
|---|---|---|---|
| 2006/0102931 A1* | 5/2006 | Kopley et al. ................. | 257/192 |
| 2006/0220060 A1 | 10/2006 | Nakata et al. | |
| 2008/0108196 A1* | 5/2008 | Chu .............................. | 438/285 |
| 2008/0203541 A1 | 8/2008 | Makiyama | |
| 2009/0042344 A1* | 2/2009 | Ye et al. ........................ | 438/172 |
| 2009/0246924 A1* | 10/2009 | Niiyama et al. .............. | 438/285 |

FOREIGN PATENT DOCUMENTS

| | | | |
|---|---|---|---|
| JP | 2006-286942 A | 10/2006 | |
| JP | 2008-205392 A | 9/2008 | |
| JP | 2008-283202 A | 11/2008 | |

OTHER PUBLICATIONS

Japanese Office Action dated Sep. 3, 2013, issued in corresponding Japanese Patent Application No. 2009-284464, w/English translation.

(Continued)

*Primary Examiner* — Zandra Smith
*Assistant Examiner* — Toniae Thomas
(74) *Attorney, Agent, or Firm* — Westerman, Hattori, Daniels & Adrian, LLP

(57) ABSTRACT

A method for fabricating a semiconductor device includes: forming a GaN-based semiconductor layer on a substrate; forming a gate insulating film of aluminum oxide on the GaN-based semiconductor layer at a temperature equal to or lower than 450° C.; forming a protection film on an upper surface of the gate insulating film; performing a process with an alkaline solution in a state in which the upper surface of the gate insulating film is covered with the protection film; and forming a gate electrode on the gate insulating film.

18 Claims, 12 Drawing Sheets

(56) References Cited

OTHER PUBLICATIONS

Ye P. D. et al., "GaN metal-oxide-semiconductor high-electron-mobility-transistor with atomic layer deposited Al2O3 as gate dielectric", Applied Physics Letters, American Institute of Physics, 86, 063501, pp. 1-3, (2005), Japanese Office Action dated Sep. 3, 2013.

Yuanzheng Yue. et al., "AlGaN/GaN MOS-HEMT With HfO2 Dielectric and Al2O3 Interfacial Passivation Layer Grown by Atomic Layer Deposition", IEEE Electron Device Letters, vol. 29, No. 8, pp. 838-840, Aug. (2008), Japanese Office Action dated Sep. 3, 3013.

* cited by examiner

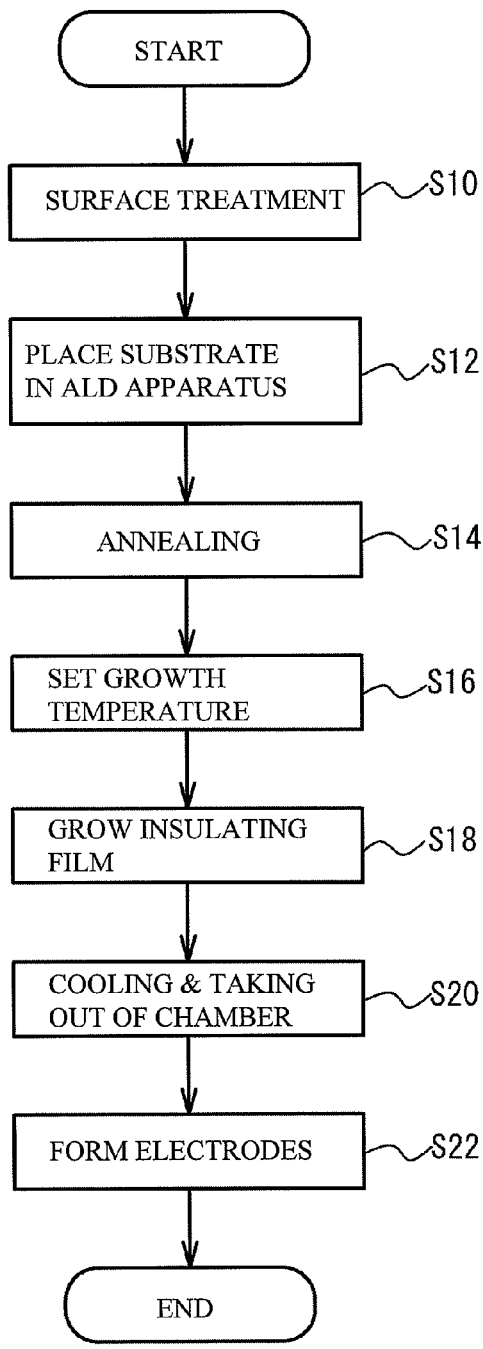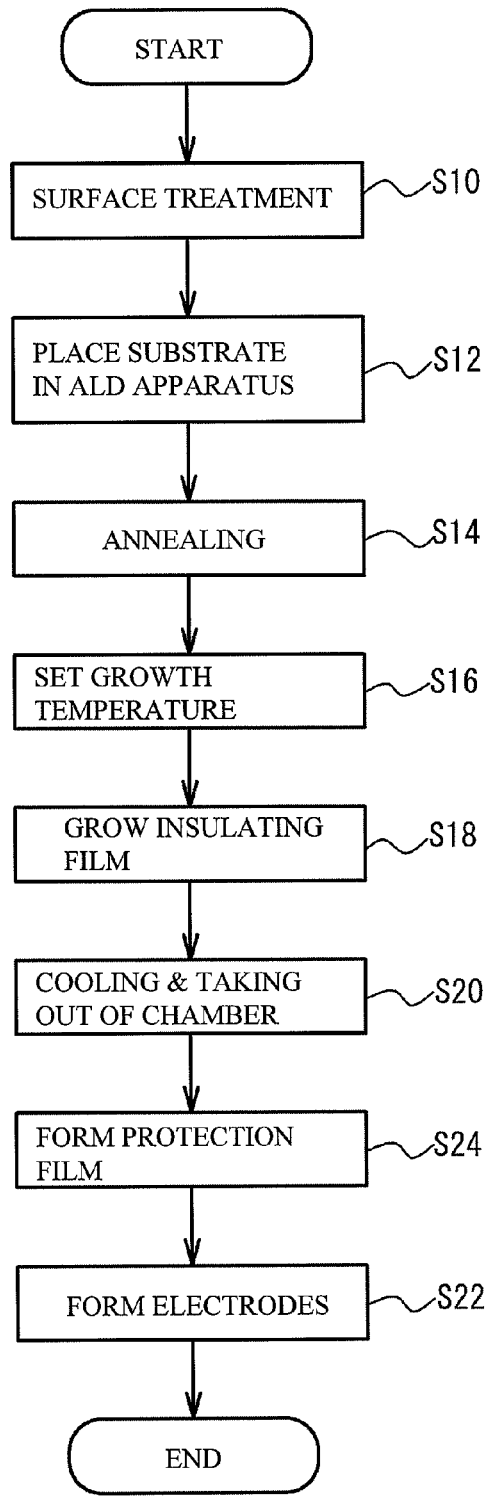

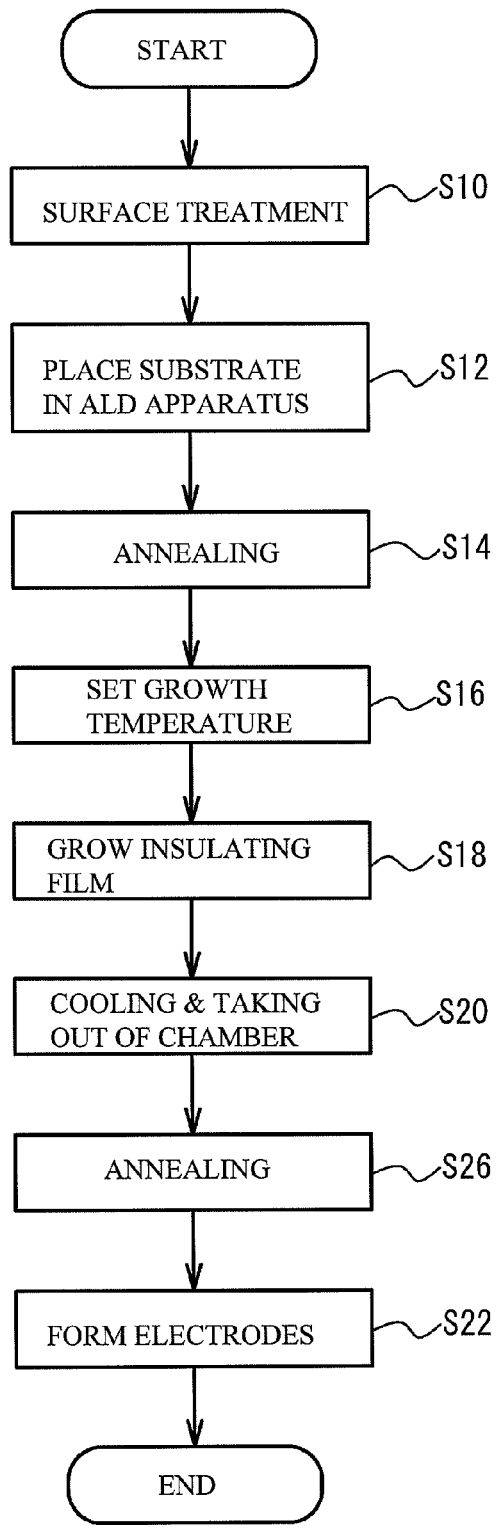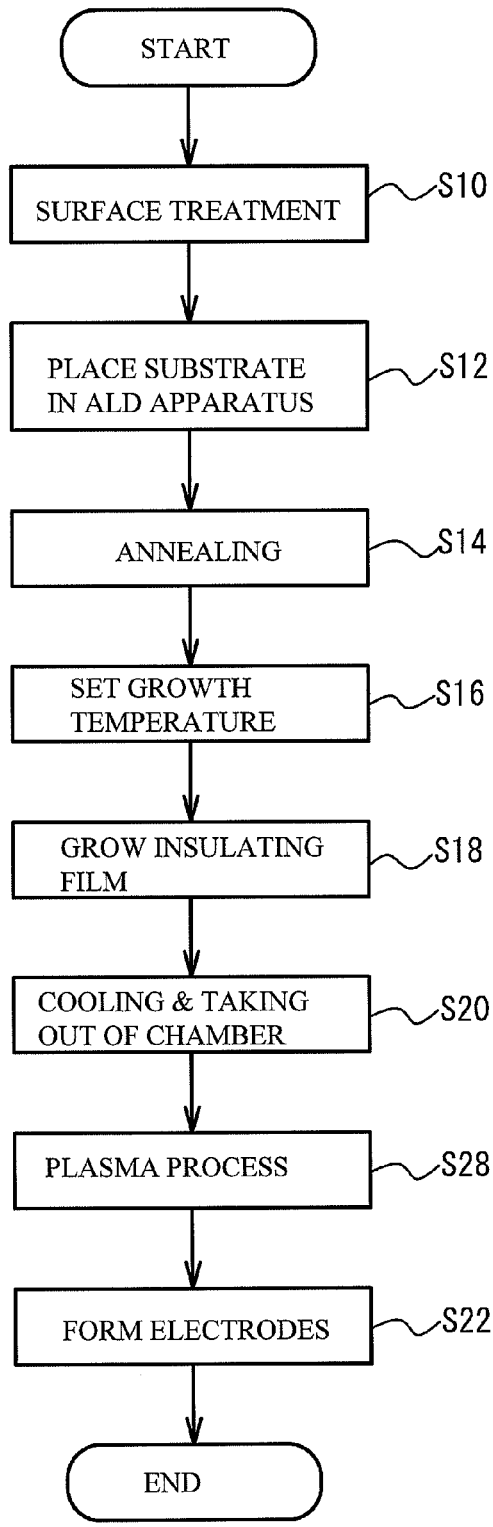

METHOD FOR FABRICATING SEMICONDUCTOR DEVICE

CROSS-REFERENCE TO RELATED APPLICATION

This application is based upon and claims the benefit of priority of the prior Japanese Patent Application No. 2008-324798, filed on Dec. 19, 2008, the entire contents of which are incorporated herein by reference.

BACKGROUND (i) Technical Field

A certain aspect of the embodiments discussed herein is related to a method for fabricating a semiconductor device, and is more particularly related to a method for fabricating a semiconductor device including a step of forming a gate insulating film on a GaN-based semiconductor layer.

(ii) Related Art

Field effect transistors (FETs) using a compound semiconductor containing Ga (gallium) and N (nitrogen) (GaN-based semiconductor) draw a lot of attention as devices capable of operating at high frequencies (radio frequencies) and outputting high power. The GaN-based semiconductor is a semiconductor that contains gallium nitride (GaN), and may be GaN, AlGaN, InGaN or AlInGaN. The AlGaN is a mixture crystal of GaN and AlN (aluminum nitride), and AlGaN is a mixture crystal of GaN and InN (indium nitride), while AlInGaN is a mixture crystal of GaN, AlN and InN.

A metal insulator semiconductor FET (MISFET) is known as an FET using the GaN-based semiconductor (see Japanese Laid-Open Patent Publication No. 2006-286942). The MISFET has a gate insulating film between a GaN-based semiconductor layer and a gate electrode. The gate insulating film of the MISFET suppresses leakage current between the gate electrode and the semiconductor layer.

However, the gate insulating film grown by a low-temperature growth method such as atomic layer deposition (ALD) may be etched by an alkaline solution used during a process. This may cause leakage current flow between the gate electrode and the semiconductor layer. Particularly, in a case where reverse leakage current from the gate electrode to the semiconductor layer caused by applying the electric field in the reverse direction concentrates on a faulty portion in the gate insulating film, the FET may be broken down or faulty. A similar problem may arise in CVD or sputtering.

SUMMARY

It is an object of the present invention to provide a method for fabricating a more reliable semiconductor device in which the gate insulating film is hardly etched.

According to an aspect of the present invention, there is provided a method for fabricating a semiconductor device including: forming a GaN-based semiconductor layer on a substrate; forming a gate insulating film of aluminum oxide on the GaN-based semiconductor layer at a temperature equal to or lower than 450° C.; forming a protection film on an upper surface of the gate insulating film; performing a process with an alkaline solution in a state in which the upper surface of the gate insulating film is covered with the protection film; and forming a gate electrode on the gate insulating film.

According to another aspect of the present invention, there is provided a method for fabricating a semiconductor device including: forming a GaN-based semiconductor layer on a substrate; forming a gate insulating film of aluminum oxide on the GaN-based semiconductor layer at a temperature equal to or lower than 450° C.; annealing the gate insulating film at a temperature equal to or higher than a growing temperature of the gate insulating film; performing a process with an alkaline solution after the annealing; and forming a gate electrode on the gate insulating film.

According to a further aspect of the present invention, there is provided a method for fabricating a semiconductor device including: forming a GaN-based semiconductor layer on a substrate; forming a gate insulating film of aluminum oxide on the GaN-based semiconductor layer at a temperature equal to or lower than 450° C.; performing a plasma process for the gate insulating film with O2 or N2; performing a process with an alkaline solution after the plasma process; and forming a gate electrode on the gate insulating film.

BRIEF DESCRIPTION OF THE DRAWINGS

FIGS. 2A and 2B are respectively flowcharts that illustrate methods for forming insulating films in the samples A and B;

FIGS. 5A and 5B are respectively flowcharts that illustrate methods for forming insulating films in samples C and D;

DETAILED DESCRIPTION

Figure 1A:
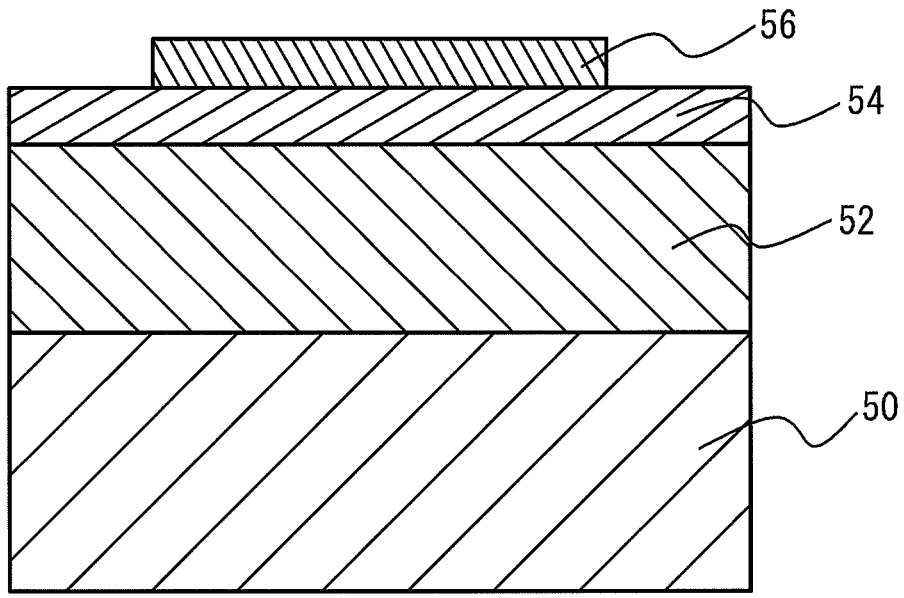
FIGS. 1A and 1B are respectively cross-sectional views of samples A and B used in an experiment.

First, experiments conducted by the inventors are described. Samples used in the experiments are configured as follows. FIG. 1A is a cross-sectional view of sample A used in the experiments, and FIG. 1B is a cross-sectional view of sample B used in the experiments.

As illustrated in FIG. 1A, the sample A has a substrate 50 on which a GaN-based semiconductor layer 52 made of GaN is formed by MOCVD (Metal Organic CVD). An aluminum oxide film that functions as an insulating film 54 is formed on the GaN-based semiconductor layer 52. An electrode 56 is formed on the insulating film 54 and is composed of a Ni layer on the GaN-based semiconductor layer 52 and an Au film formed on the Ni layer.

Figure 1B:
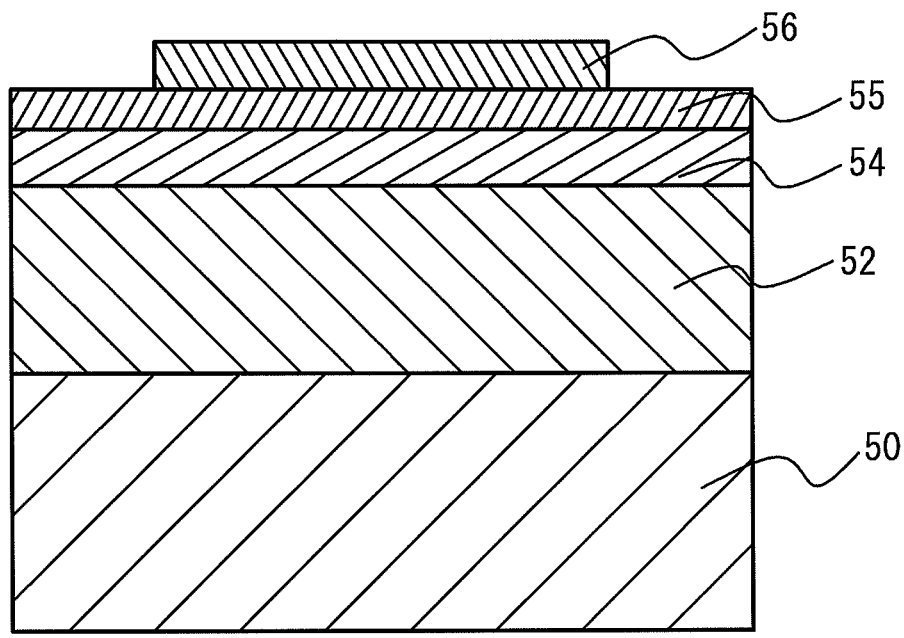

As illustrated in FIG. 1B, the sample B has a silicon oxide film that functions as a protection film 55 in addition to the structure of the sample A. The electrode 56 is provided on the protection film 55.

Next, the methods for fabricating the samples A and B are described. FIG. 2A illustrates a process for forming the insulating film 54 and the electrode 56 of the sample A, and FIG. 2B illustrates a process for forming the insulating film 54, the protection film 55 and the electrode 56.

As illustrated in FIG. 2A, the process commences with a surface treatment applied to the surface of the GaN layer (step S10). The surface treatment may include removal of organic contamination by cleaning with a mixed solution of sulfuric acid and hydrogen peroxide solution, removal of particle contamination by a mixed solution of ammonia and hydrogen peroxide solution, and a treatment with ammonia water heated at a temperature of about 40° C. The substrate 50 is placed in an ALD (Atomic Layer Deposition) apparatus (step S12). In a case where aluminum oxide is formed by the ALD method, the first step is to supply the substrate 50 with TMA (TriMethyl Aluminum), which is absorbed to a surface of the substrate 50. Next, TMA is purged. After that, $O_2$ or $O_3$ is supplied to the substrate 50 and is reacted with TMA absorbed to the surface of the substrate 50. Then, the surface of the substrate 50 is purged. This process results in deposition of a one-atom layer. The ALD method repeatedly carries out a sequence of the above steps to thus form a desired film thickness. The substrate 50 is annealed in the ALD apparatus at 500° C., which is higher than the growing temperature of aluminum oxide (step S14). In this process, the temperature of 500° C. is kept for approximately 5 minutes in a state in which a carrier gas of nitrogen flows. Then, the temperature is lowered to 400° C. that is the growing temperature (step S16). In the ALD apparatus, TMA and $O_3$ are alternately supplied in order to grow an insulating film of aluminum oxide (step S18). In this step, the temperature may be set at 450° C. and the pressure may be set at 1 torr. TMA may be supplied for 0.3 seconds, and $O_3$ may be supplied for 0.3 seconds. A purge with nitrogen gas is carried out for 5 seconds each time the gas is switched to $O_3$ from TMA and vice versa. One cycle is defined by a once supply of TMA and that of $O_3$. The insulating film 54 of aluminum oxide having a thickness of about 40 nm may be formed by 500 cycles. Then, the temperature is lowered for cooling and the substrate 50 is taken out of the growth chamber of the ALD apparatus (step S20). The insulating film 54 is patterned by a photolithography process, and the electrode 56 is formed on the protection film 55 (step S22).

As illustrated in FIG. 2B, the sample B is fabricated by form the protection film 55 on the insulating film 54 by sputtering that is performed between step S20 and step S22 (step S24). The protection film 55 may be made of silicon oxide and may be approximately 3 nm thick. Then, a pattern is formed on the protection film 55 and the electrode 56 is thus formed on the protection film 55 (step S22).

Figure 3A:
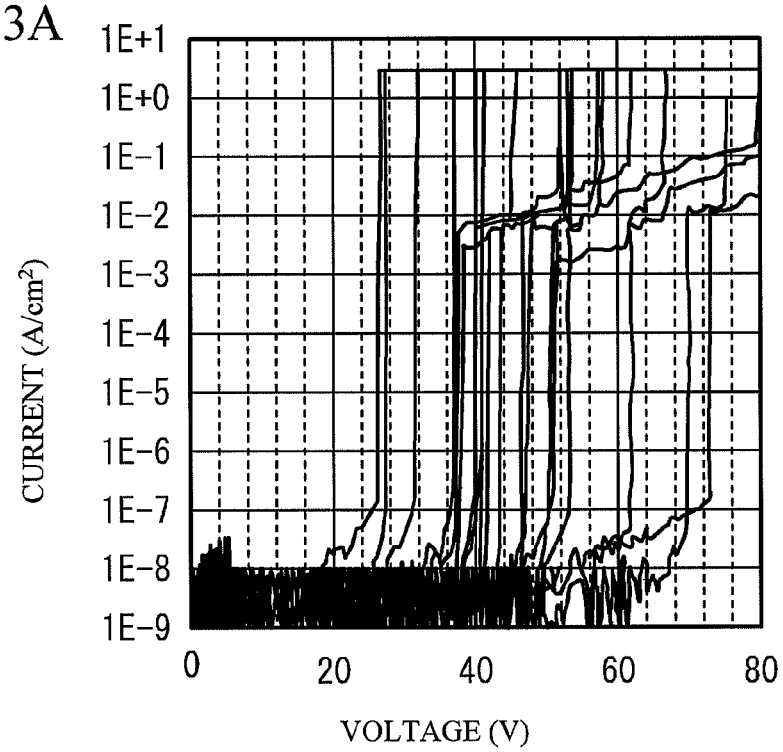
FIGS. 3A and 3B are respectively graphs that illustrate measurement results of reverse leakage currents in the samples A and B.
Figure 3B:
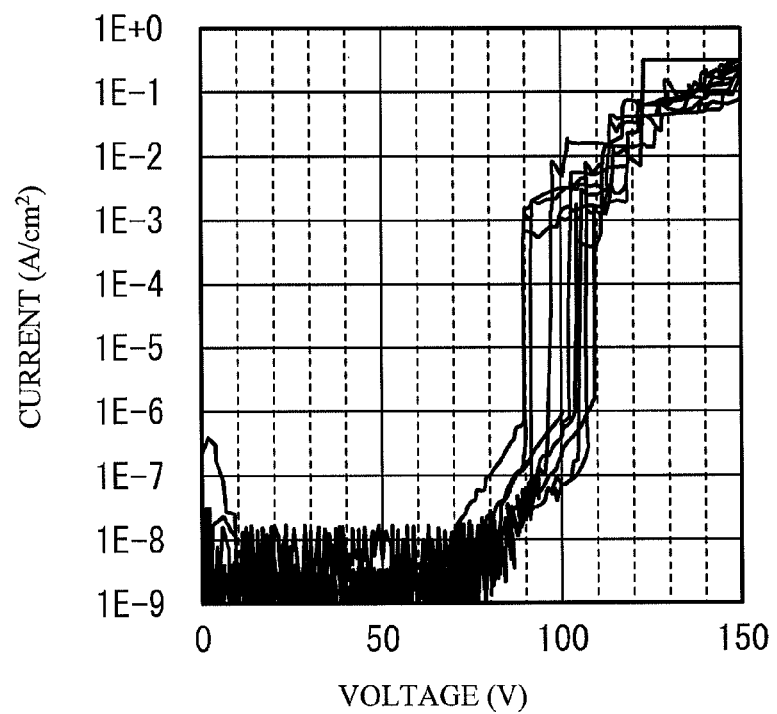

The experimental results are now described. FIG. 3A illustrates a current v. voltage characteristic obtained by measuring reverse leakage current while the voltage applied to the electrode 56 is changed. FIG. 3B illustrates a similar characteristic obtained for the sample B. In FIGS. 3A and 3B, the horizontal axis is the voltage (V), and the vertical axis is the reverse leakage current ($A/cm^2$). The measurement is carried out multiple times for multiple samples A and B. Solid lines in FIGS. 3A and 3B denote the measurement results for the multiple samples A and B.

As illustrated in FIG. 3A, breakdown of samples A takes place at a minimum voltage of 37.7 V due to an increase in the reverse leakage current. The voltages that cause breakdown (breakdown voltage) ranges from 37.7 V to 69.9 V. In contrast, as illustrated in FIG. 3B, breakdown of samples B takes place at a minimum voltage of 69.9 V due to an increase in the reverse breakdown voltage. The breakdown voltage ranges from 92.0 V to 106.6 V.

Figure 4:
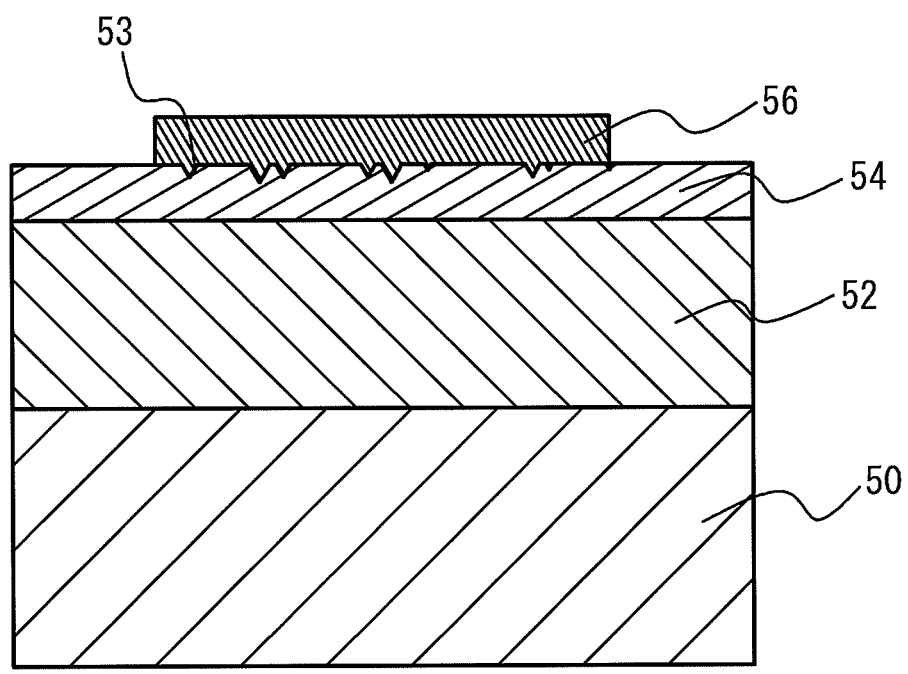
FIG. 4 is a schematic cross-sectional view of the sample A.

As described above, breakdown of samples A takes place at comparatively low voltages, and the breakdown voltages fall in a wide range. In contrast, breakdown of samples B do not take place at comparatively low voltages, and the breakdown voltages fall in a narrow range, as compared to those of samples A. A mechanism that results in the above difference will be described in conjunction with the drawings. FIG. 4 is a schematic cross-sectional view of the sample A.

As illustrated in FIG. 4, the insulating film 54 is eroded, and resultant eroded portions 53 are formed on the surface of the insulating film 54. This is caused by an alkaline developing solution (obtained by attenuating 4.9% TAMH (Tetra Methyl Ammonium Hydroxyde) by 50% used in the photolithography process at step S22 in FIG. 2A. It is to be noted that aluminum oxide that forms the insulating film 54 is soluble in alkaline solutions. Additionally, the erosion of the insulating film 54 takes place in a case where the insulating film 54 is formed by sputtering or CVD. Particularly, erosion is liable to take place in a case where the insulating film 54 is formed at temperatures as low as 450° C. or lower. Erosion is remarkable at temperatures equal to or lower than 400° C. In the eroded portions 53, the distances between the semiconductor layer 52 and the electrode 56 are shortened. Thus, the reverse leakage current from the electrode 56 to the semiconductor layer 52 is likely to take place. The breakdown observed in the experiments is caused by the leakage currents that concentrate on the eroded portions 53. The breakdown voltage is changed by the sizes of the eroded portions 53. Thus, the samples A have a wide dispersion of breakdown voltage.

In contrast, the samples B have the protection film 55 made of silicon oxide on the insulating film 54. Silicon oxide is more etch-resistant to alkaline solutions than aluminum oxide, which is thus protected. Eventually, erosion of the insulating film 54 is suppressed and the occurrence of the reverse leakage current is suppressed. Thus, low-voltage breakdown does not take place, and only high-voltage breakdown takes place in the samples B.

A description will now be given of a sample prepared by another method for protecting the insulating film 54. FIG. 5A illustrates a method for forming the insulating film 54 and the electrode 56 of sample C, and FIG. 5B illustrates a method for forming the insulating film 54 and the electrode 56 of sample D.

As illustrated in FIG. 5A, in sample C, annealing with an anneal chamber is carried out between steps S20 and S22 (step S26). Annealing may be carried out in an atmosphere of nitrogen gas at 700° C. for 5 minutes. This annealing improves the etch resistance. Then, a pattern is formed on the insulating film 54 by the photolithography process and the electrode 56 is thus formed (step S22). The other steps are the same as those illustrated in FIG. 2A.

As illustrated in FIG. 5B, in sample D, a plasma process using an asking apparatus is carried out between steps S20 and S22 (step S28). The plasma process uses $O_2$ and is carried out at a plasma power of 800 W for 10 minutes. This process improves the etch resistance. Then, a pattern is formed on the insulating film 54 by the photolithography process and the electrode 56 is thus formed (step S22). The other steps are the same as those illustrated in FIG. 2A.

Figure 6:
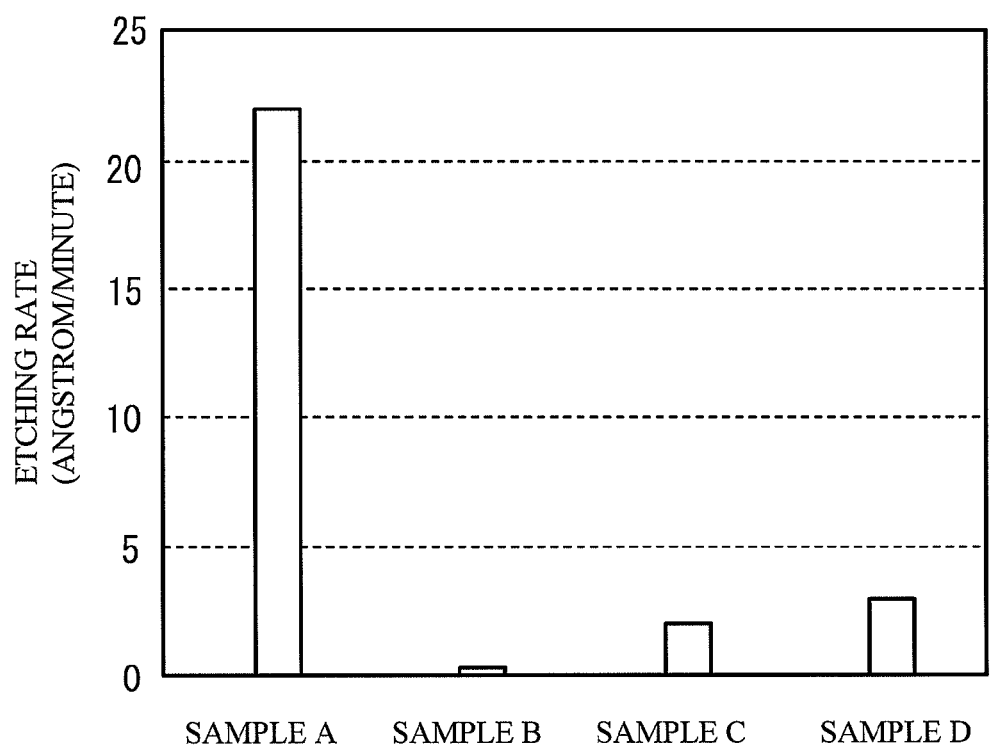
FIG. 6 illustrates results of measurements of etching rates in the samples A, B, C and D.

A description will now be given of experimental results obtained by measuring the etching rate of the insulating film that contacts the gate insulating film using an alkaline solution in each of the samples A through D. FIG. 6 illustrates the experimental results in which the horizontal axis denote samples A through D and the vertical axis denotes the etching rate (angstrom per minute).

As illustrated in FIG. 6, the etching rates of samples B, C and D are greatly reduced, as compared to the etching rate of sample A. Particularly, the smallest etching rate is obtained in sample B in which the protection film 55 is formed on the insulating film 54. The etching rate of the insulating film 54 is reduced by protecting the insulating film 54 with the protection film 55 or applying the anneal or plasma process to the insulating film 54. It is thus possible to suppress the occurrence of the reverse leakage current between the electrode 56 and the semiconductor layer 52.

Figure 7A:
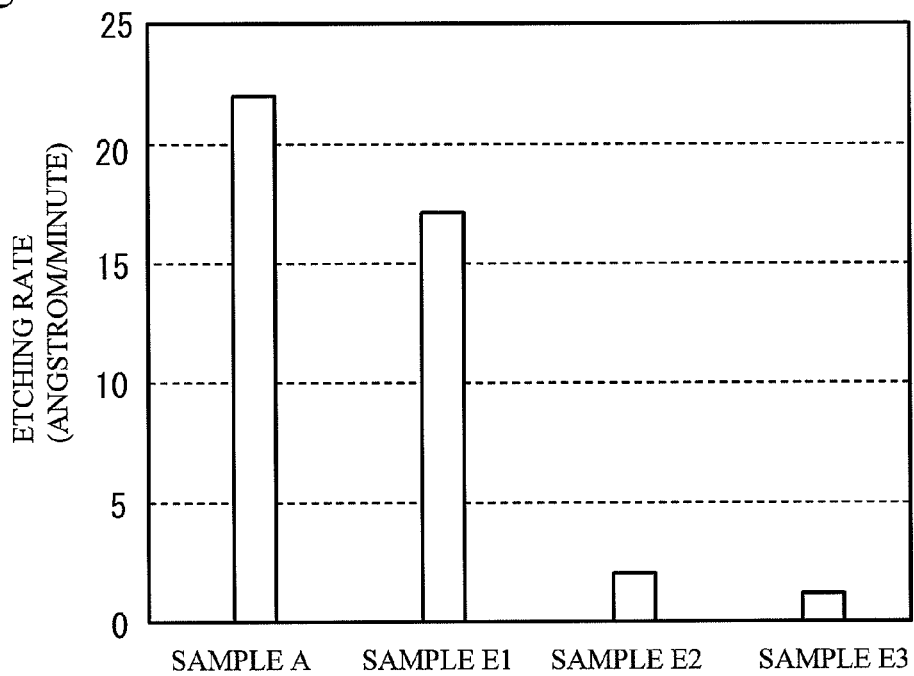
FIG. 7A illustrates results of measurement of etching rates obtained by changing the period of time for annealing.
Figure 7B:
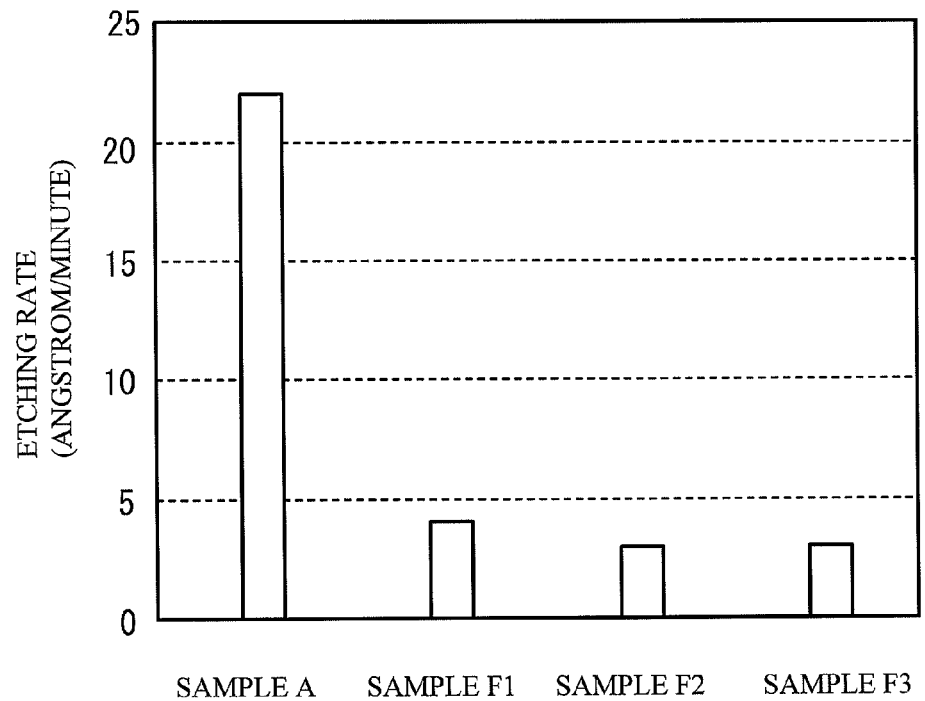
FIG. 7B illustrates results of measurement of etching rates obtained by changing the period of time for a plasma process.

A description will now be given of experimental results obtained by measuring the etching rate as the period of time for annealing and that for the plasma process are changed. FIG. 7A illustrates the measurement results of the etching rate as the period of time for annealing is changed, and FIG. 7B illustrates the measurement results of the etching rate as the period of time for the plasma process. In FIG. 7A, annealing is carried out for 5 minutes. In each of FIGS. 7A and 7B, the horizontal axis denotes samples A through D, and the vertical axis denotes the etching rate (angstrom per minute).

The experimental results of annealing are now explained. In FIG. 7A, sample A has been described with reference to FIG. 6, and samples E1, E2 and E3 are annealed for 5 minutes at 500° C., 700° C. and 900° C., respectively.

As illustrated in FIG. 7A, it is possible to suppress the etching rates of the samples E1 through E3 in which annealing is carried out at a temperature equal to or higher than the growing temperature of the gate insulating film, as compared to sample A in which annealing is not carried out. Further, as the anneal temperature is raised, the etching rate is suppressed more greatly. Particularly, the etching rate is suppressed very greatly at temperatures equal to or higher than 700° C.

The experimental results of the plasma process are now described. FIG. 7B illustrates the measurement results of the etching rate as the period of time foe the plasma process is changed. The plasma process uses $O_2$, and samples F1, F2 and F3 are prepared by performing the plasma process at a plasma power of 800 W for 5, 10 and 20 minutes, respectively.

As illustrated in FIG. 7B, the etching rates of the samples F1, F2 and F3 are suppressed, as compared to the sample A in which the plasma process is not performed. In the plasma process, the etching rate is not changed considerably with regard to the plasma process time. This is because the plasma process is oriented to the process for the surface, and the results are not changed greatly with time even when the plasma process is carried out over a predetermined period of time. Annealing suppresses the etching rate more greatly than the plasma process, as can be seen from FIGS. 7A and 7B.

A description will now be given of examples of the semiconductor device in which the etching rate of the insulating film that contacts the gate electrode is suppressed.

EXAMPLE 1

Figure 8A:
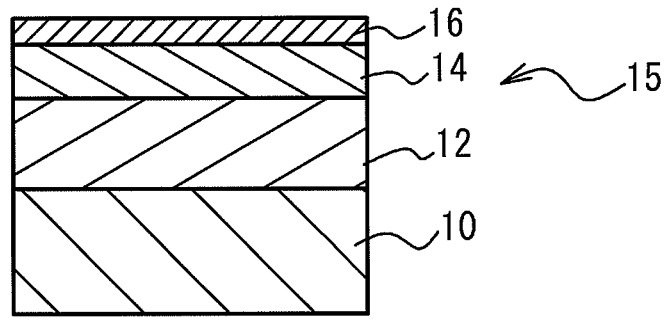
FIGS. 8A, 8B and 8C are cross-sectional views that illustrate a first part of a method for fabricating an FET in accordance with example 1.

Example 1 is a lateral FET in which a protection film is provided on a gate insulating film. FIGS. 8A through 8C, 9A through 9C, and 10 are cross-sectional views of the lateral FET in accordance with example 1. Referring to FIG. 8A, a buffer layer (not illustrated for the sake of simplicity) is formed on a silicon substrate 10 by, for example, MOCVD. Next, a GaN electron conduction layer 12, which may be 1000 nm thick, for example, is formed on the buffer layer. Then, an AlGaN electron supply layer 14, which may be 30 nm thick, for example, is formed on the GaN electron conduction layer 12. The Al composition ratio of the AlGaN electron supply layer 14 may be, for example, 0.2. A GaN cap layer 16, which may be 3 nm thick, for example, is formed on the AlGaN electron supply layer 14. Through the above-described steps, a GaN-based semiconductor layer 15 is formed on the substrate 10 in which the layer 15 is composed of the GaN electron conduction layer 12, the AlGaN electron supply layer 14 and the GaN cap layer 16.

Figure 8B:
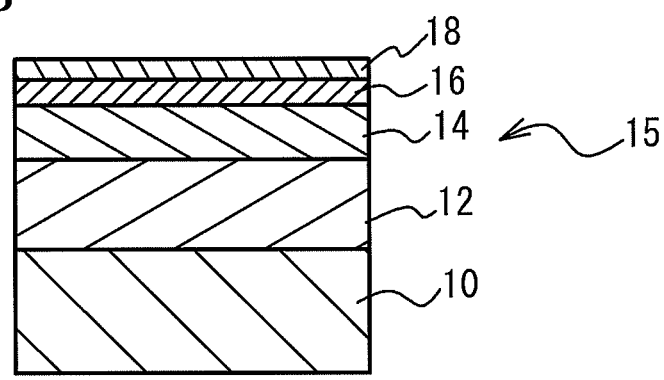

As illustrated in FIG. 8B, a gate insulating film 18 is formed on the GaN-based semiconductor layer 15. For example, the gate insulating film 18 may be an aluminum oxide film and may be 40 nm thick. The gate insulating film 18 may be formed by the same process as that illustrated in FIG. 2B. In the ALD apparatus, annealing is carried out at a temperature equal to or higher than the growing temperature of the gate insulating film 18. Then, the gate insulating film 18 having a thickness of 40 nm is formed in the ALD apparatus by the ALD method.

Figure 8C:
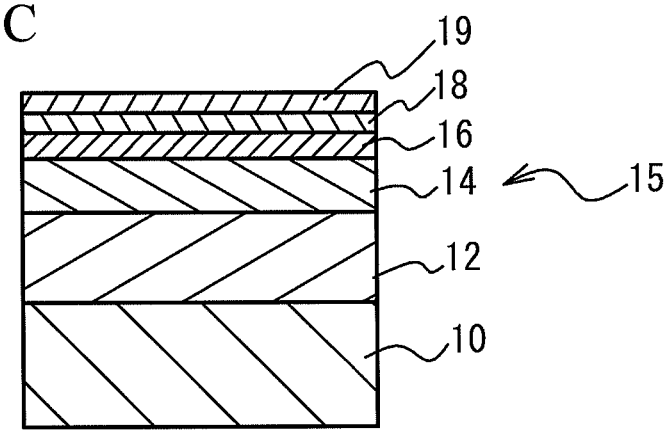

As illustrated in FIG. 8C, a protection film 19, which may be made of silicon oxide and may be 3 nm thick, for example, is formed on the upper surface of the gate insulating film 18.

Figure 9A:
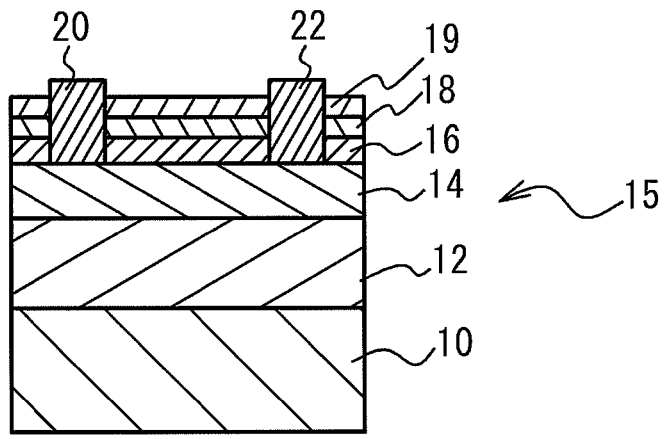
FIGS. 9A, 9B and 9C are cross-sectional views that illustrate a second part of the method that follows the first part.

As illustrated in FIG. 9A, device-to-device isolation is formed by etching using a $BCl_3/Cl_2$ gas, and openings are formed in the gate insulating film 18 and the protection film 19. A source electrode 20 and a drain electrode 22 are formed in the openings. Each of the electrodes 20 and 22 has an underlying layer of Al, and an upper layer of Ti.

Figure 9B:
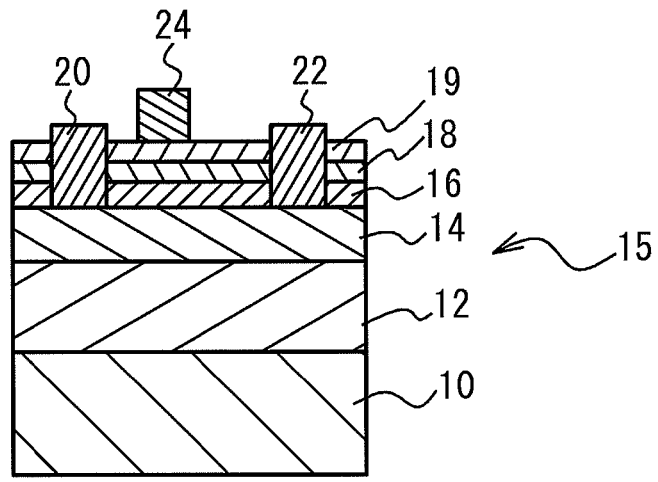
Figure 9C:
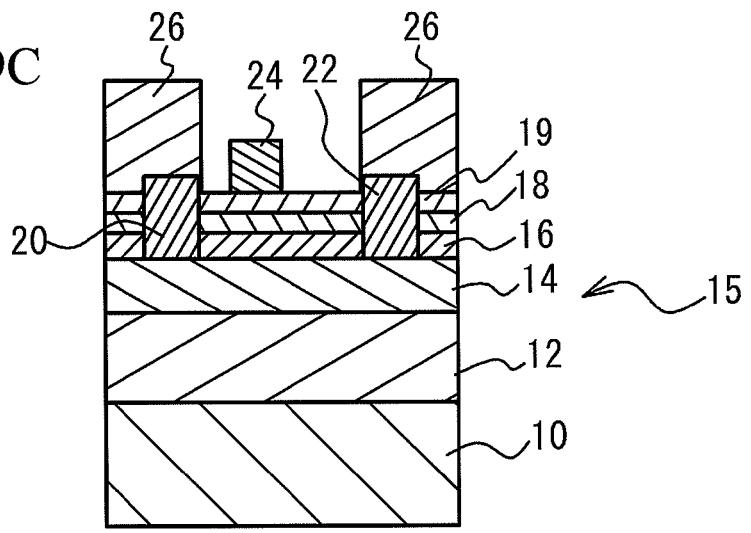
Figure 10:
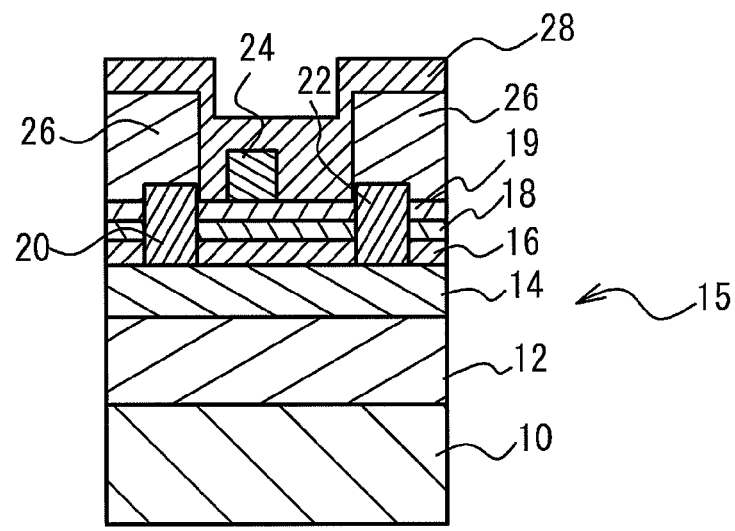
FIG. 10 is a cross-sectional view that illustrates a third part of the method that follows the second part.

As illustrated in FIG. 9B, a pattern is formed on the protection film 19 by the photolithography process, and a gate electrode 24 such as Ni/Au is formed by the liftoff process. This process may use a developing solution of an alkaline solution such as a TMAH solution in the state where the upper surface of the gate insulating film 18 is covered with the protection film 19. The process using the developing solution of the alkaline solution is executed for the first time after the protection film 19 is formed on the upper surface of the gate insulating film 18. Thus, the gate insulating film 18 is not eroded by the process using the alkaline solution. The liftoff process may use another developing solution such as choline (Trimethy-2-hidroxyethyl ammonium hydroxide) solution. As illustrated in FIG. 9C, interconnection layers 26, which may be made of an Au-based metal, are formed so as to be respectively connected to the source electrode 20 and the drain electrode 22. After that, as illustrated in FIG. 10, a protection film 28 is formed so as to cover the gate insulating film 18, the protection film 19, the gate electrode 24 and the interconnection layers 26. The semiconductor device of example 1 is complete through the above-described process.

According to example 1, the protection film 19 is formed on the gate insulating film 18 (step S24 in FIG. 2B), and the pattern is formed on the protection film 19 by the photolithography process to form the gate electrode 24 (step S22). That is, the alkaline solution is used after the gate insulating film 18 is covered with the protection film 19. It is thus possible to suppress the gate insulating film from being eroded and to prevent the occurrence of the reverse leakage current. As a result of these advantages, it is possible to suppress the occurrence of failure or fault of FETs.

In example 1, the protection film 19 is formed by sputtering. The protection film 19 may be formed by another method such as the ALD method. The gate insulating film 18 may be formed by not only the ALD method but also another method such as sputtering or CVD.

In the foregoing, the alkaline solution is used in the process of forming the gate electrode 24. As long as the protection film 19 is formed, the gate insulating film 18 is protected from erosion by the alkaline solution in another process that uses the alkaline solution. That is, the gate insulating film 18 is protected even when the alkaline solution is used after the gate electrode 24 is formed. Preferably, the alkaline solution is not used in any process prior to the process of forming the protection film 19 in order to prevent the gate insulating film 18 from being eroded.

EXAMPLE 2

Figure 11:
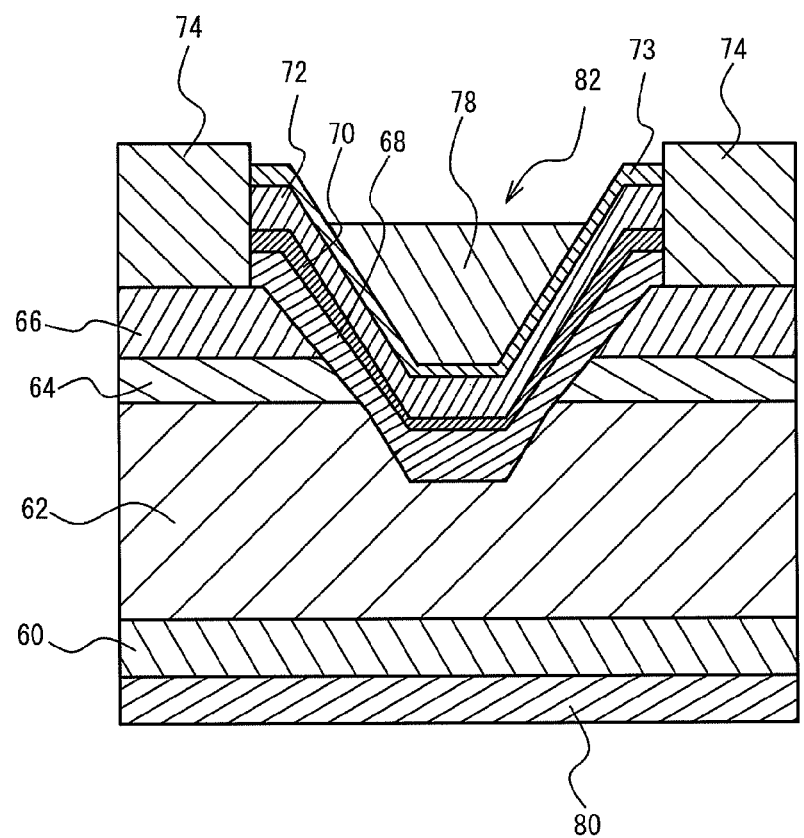
FIG. 11 is a cross-sectional view of an FET in accordance with example 2.

Example 2 is a vertical FET in which a protection film is formed on a gate insulating film. FIG. 11 is a cross-sectional view of an exemplary structure of the vertical FET in accordance with example 2. Referring to FIG. 11, there are provided an n-type GaN drift layer 62, a p-type GaN barrier layer 64 and an n-type GaN cap layer 66 on a conductive SiC substrate 60. An opening 82 that reaches the drift layer 62 is formed in the stacked layers described above. A regrown layer is provided so as to cover the opening 82. The regrown layer includes a GaN electron conduction layer 68 with impurities being undoped, and an AlGaN electron supply layer 70 with impurities being undoped. A gate insulating film 72 is formed on the electron supply layer 70. The gate insulating film 72 may be formed by the process illustrated in FIG. 2B. A protection film 73 made of silicon oxide is formed on the gate insulating film 72. A source electrode 74 is formed on the cap layer 66 so as to surround the opening 82. A gate electrode 78 is formed on the protection film 73 in the opening 82. A drain electrode 80 is formed on a back surface of the substrate 60.

The FET with the protection film on the gate insulating film may be the lateral FET in which the source electrode 20 and the drain electrode 22 are formed on the GaN-based semiconductor layer 15 as configured in accordance with example 1. The FET with the protection film on the gate insulating film may be the vertical FET in which the source electrode 74 is formed on the GaN-based semiconductor layer and the drain electrode 80 is formed on the surface of the substrate 60 opposite to the surface thereof on which the GaN-based semiconductor layer is formed. The protection film is not limited to silicon oxide but may be made of another material that has a high etch-resistance to the alkaline solutions, which may be silicon oxynitride, hafnium oxide or zirconium oxide.

EXAMPLE 3

Figure 12A:
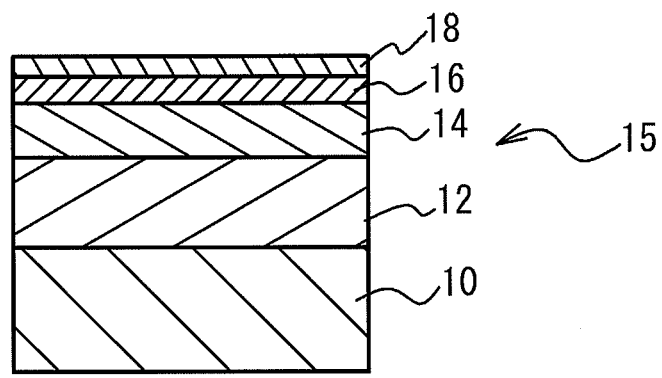
FIGS. 12A and 12B are cross-sectional views that illustrate a method for fabricating an FET in accordance with example 3.
Figure 12B:
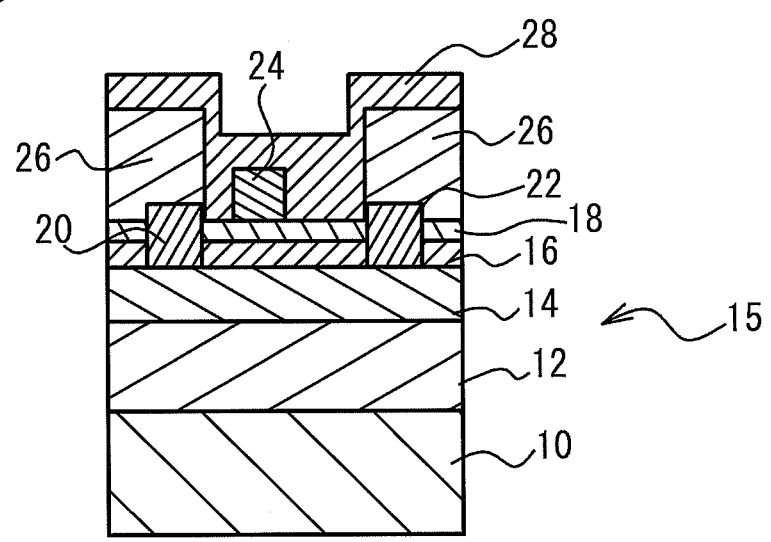

Example 3 is a lateral FET that has been subjected to annealing at a temperature equal to or higher than the growing temperature of the gate insulating film. FIGS. 12A and 12B are cross-sectional views that illustrate a method for fabricating the semiconductor device in accordance with example 3.

Referring to FIG. 12A, the gate insulating film 18, which is made of aluminum oxide and is 40 nm thick, for example, is formed on the GaN-based semiconductor layer 15 in a process similar to the process illustrated in FIGS. 8A and 8B. After the gate insulating film 18 is formed, annealing is carried out in the state illustrated in FIG. 12A at 700° C. for 5 minutes.

After annealing, device-to-device isolation is formed by etching using a BCl3/Cl2 gas, and openings are formed in the gate insulating film 18 and the protection film 19. The source electrode 20 and the drain electrode 22 are formed in the openings. Each of the electrodes 20 and 22 has an underlying layer of Al, and an upper layer of Ti. Further, the gate electrode 24, which may be a Ni/Au layer structure is formed on the gate insulating film 18 by the photolithography process. This process may use a developing solution of an alkaline solution. Then, the interconnection layers 26, which may be made of an Au-based metal, are formed so as to be respectively connected to the source electrode 20 and the drain electrode 22. The protection film 28 made of, for example, silicon nitride, is formed so as to cover the gate insulating film 18, the gate electrode 24 and the interconnection layers 26. The semiconductor device of example 3 illustrated in FIG. 12B is completed through the above-described process.

According to example 3, annealing is carried out after the gate insulating film 18 is formed (step S24 in FIG. 5A), and a pattern is formed on the protection film 19 by the photolithography process to form the gate electrode 24 (step S22). That is, the alkaline solution is used after the etch-resistance of the gate insulating film 18 is improved by annealing. It is thus possible to suppress erosion of the gate insulating film 18 and suppress the occurrence of the reverse leakage current. As a result of these advantages, it is possible to suppress the occurrence of failure or fault of FETs. Preferably, the alkaline solution is not used prior to the anneal process in order to prevent the gate insulating film 18 from being eroded.

EXAMPLE 4

Figure 13:
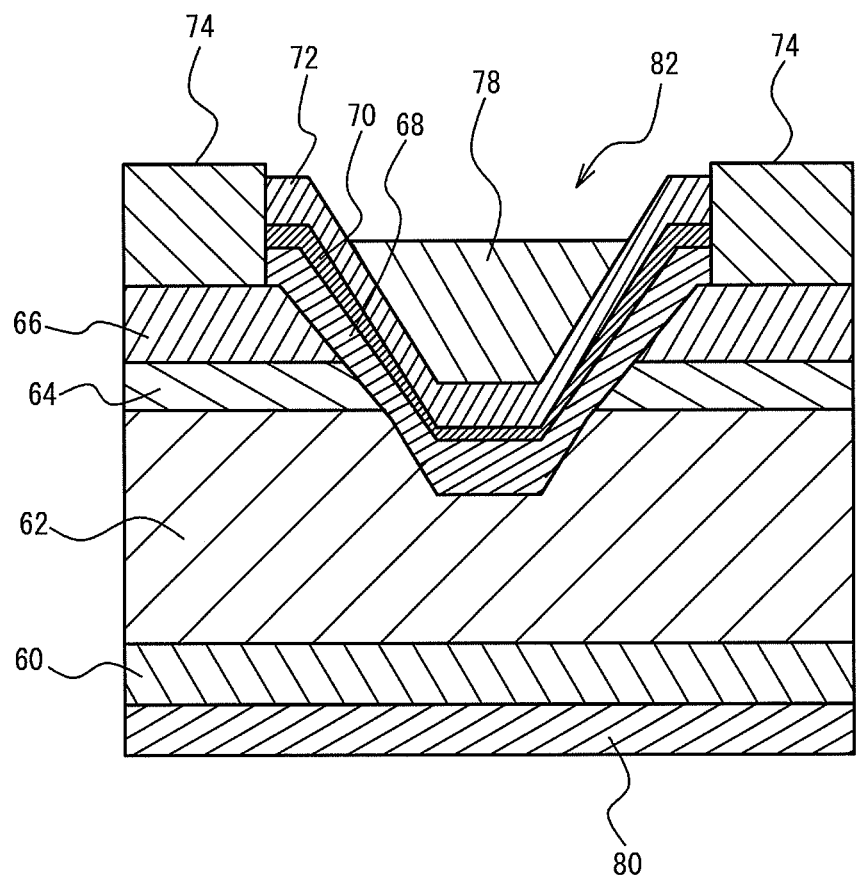
FIG. 13 is a cross-sectional view of an FET in accordance with example 4.

Example 4 is a vertical FET that has been subjected to annealing. FIG. 13 is a cross-sectional view of a semiconductor device in accordance with example 4. Referring to FIG. 13, no protection film is provided over the gate insulating film 72 as in the case of the semiconductor device illustrated in FIG. 11. The gate insulating film 72 is annealed at 700° C. for 5 minutes.

EXAMPLE 5

Example 5 is a lateral FET that has been subjected to the plasma process. A description is given, with reference to cross-sectional views of FIGS. 12A and 12B, of a method for fabricating a semiconductor device in accordance with example 5.

Referring to FIG. 12A, the gate insulating film 18, which may be made of aluminum oxide and may be 40 nm thick, for example, is formed on the GaN-based semiconductor layer 15 by a process similar to that illustrated in FIGS. 8A and 8B. After the gate insulating film 18 is formed, the plasma process with $O_2$ is carried out in the state illustrated in FIG. 12A after the gate insulating film 18 is formed. After the plasma process, a sequence of processes similar to those that have been described completes the semiconductor device in accordance with example 5.

According to example 5, the plasma process is carried out after the gate insulating film 18 is formed (step S28 in FIG. 5B), and a pattern is formed on the protection film 19 by the photolithography process to form the gate electrode 24 (step S22). That is, the alkaline solution is used after the etch-resistance of the gate insulating film 18 is improved by the plasma process. It is thus possible to suppress erosion of the gate insulating film 18 and suppress the occurrence of the reverse leakage current. As a result of these advantages, it is possible to suppress the occurrence of failure or fault of FETs. Preferably, the alkaline solution is not used prior to the anneal process in order to prevent the gate insulating film 18 from being eroded.

EXAMPLE 6

Example 6 is a vertical FET that has been subjected to the plasma process. The structure of the semiconductor device of example 6 is the same as illustrated in FIG. 13, and a description thereof is thus omitted here. The plasma process with $O_2$ is applied to the gate insulating film 72.

The FET having the gate insulating film to which the anneal or plasma process has been applied may be a lateral FET in which the source electrode 20 and the drain electrode 22 are formed on the GaN-based semiconductor layer 15 as in the cases of examples 3 and 5. The FET having the gate insulating film to which the anneal or plasma process has been applied may be a vertical FET in which the source electrode 74 is formed on the GaN-based semiconductor layer and the drain electrode 80 is formed on the surface of the substrate 60 opposite to the surface thereof on which the GaN-based semiconductor layer is formed. In examples 3 and 6, the gate insulating film 18 can be prevented from being eroded by the alkaline solution. It is thus possible to obtain effects similar to those of the first and second examples (see FIG. 3B).

The substrate is not limited to silicon substrate in example 1 and the SiC substrate in example 2 but may be a sapphire substrate or a GaN substrate.

The anneal condition is not limited to that employed in examples 3 and 4 in which anneal is carried out at 700° C. for 5 minutes after the gate insulating film 18 is formed. The anneal temperature is equal to or greater than the growing temperature of aluminum nitride and is preferably 700° C. or higher. It is thus possible to greatly suppress the etching rate (see FIG. 7A). If the anneal temperature is set at 800° C., the etching rate may be further suppressed, as compared to the anneal process at 700° C. The etching rate may be much more suppressed with the anneal temperature being set at 900° C.

The plasma process is not limited to O2 but may use another gas such as N2.

If the protection film covers not only the gate electrode but also another region, the etch-resistance of the region is improved and the device is more reliable.

The present invention is not limited to the specifically described embodiments and examples, but may include other embodiments and examples without departing from the scope of the present invention.

What is claimed is:

1. A method for fabricating a semiconductor device comprising:
    forming a GaN-based semiconductor layer on a substrate;
    forming a gate insulating film of aluminum oxide on the GaN-based semiconductor layer at a temperature equal to or lower than 450° C.;
    forming a protection film on an upper surface of the gate insulating film;
    performing a process with an alkaline solution in a state in which the upper surface of the gate insulating film is covered with the protection film; and
    forming a gate electrode on the protection film.

2. The method as claimed in claim 1, wherein the protection film comprises any of silicon oxide, silicon oxynitride, hafnium oxide and zirconium oxide.

3. The method as claimed in claim 1, wherein the forming of the gate electrode uses any of an ALD process, a sputtering process and a CVD process.

4. The method as claimed in claim 1, wherein the process with the alkaline solution is performed after the gate electrode is formed.

5. The method as claimed in claim 1, further comprising forming a source electrode and a drain electrode on the GaN-based semiconductor layer.

6. The method as claimed in claim 1, further comprising forming a source electrode on a surface of the GaN-based semiconductor layer and a drain electrode on the substrate that contacts another surface of the GaN-based semiconductor layer opposite to said surface.

7. A method for fabricating a semiconductor device comprising:
    forming a GaN-based semiconductor layer on a substrate;
    forming a gate insulating film of aluminum oxide on the GaN-based semiconductor layer at a temperature equal to or lower than 450° C.;
    annealing the gate insulating film at a temperature equal to or higher than a growing temperature of the gate insulating film;
    performing a process with an alkaline solution after the annealing;
    forming a gate electrode on the gate insulating film, and
    forming a source electrode on a surface of the GaN-based semiconductor layer and a drain electrode on the substrate that contacts another surface of the GaN-based semiconductor layer opposite to said surface.

8. The method as claimed in claim 7, wherein the temperature in the annealing is equal to higher than 700° C.

9. The method as claimed in claim 7, wherein the forming of the gate electrode uses any of an ALD process, a sputtering process and a CVD process.

10. The method as claimed in claim 7, wherein the process with the alkaline solution is performed after the gate electrode is formed.

11. The method as claimed in claim 7, further comprising forming a source electrode and a drain electrode on the GaN-based semiconductor layer.

12. A method for fabricating a semiconductor device comprising:
    forming a GaN-based semiconductor layer on a substrate;
    forming a gate insulating film of aluminum oxide on the GaN-based semiconductor layer at a temperature equal to or lower than 450° C.;
    performing a plasma process for the gate insulating film with $O_2$ or $N_2$;
    performing a process with an alkaline solution after the plasma process; and
    forming a gate electrode on the gate insulating film,
    wherein the process with the alkaline solution is performed after the gate electrode is formed.

13. The method as claimed in claim 12, wherein the forming of the gate electrode uses any of an ALD process, a sputtering process and a CVD process.

14. The method as claimed in claim 12, further comprising forming a source electrode and a drain electrode on the GaN-based semiconductor layer.

15. The method as claimed in claim 12, wherein a period of time for the plasma process is five minutes or longer.

16. A method for fabricating a semiconductor device comprising:
    forming a GaN-based semiconductor layer on a substrate;
    forming a gate insulating film of aluminum oxide on the GaN-based semiconductor layer at a temperature equal to or lower than 450° C.;
    performing a plasma process for the gate insulating film with $O_2$ or $N_2$;
    performing a process with an alkaline solution after the plasma process; and
    forming a gate electrode on the gate insulating film,
    forming a source electrode on a surface of the GaN-based semiconductor layer and a drain electrode on the substrate that contacts another surface of the GaN-based semiconductor layer opposite to said surface.

17. The method as claimed in claim 16, wherein the forming of the gate electrode uses any of an ALD process, a sputtering process and a CVD process.

18. The method as claimed in claim 16, wherein a period of time for the plasma process is five minutes or longer.

* * * * *